US006283612B1

(12) United States Patent
Hunter

(10) Patent No.: US 6,283,612 B1
(45) Date of Patent: Sep. 4, 2001

(54) LIGHT EMITTING DIODE LIGHT STRIP

(76) Inventor: Mark A. Hunter, 1211 Alabama St., Huntington Beach, CA (US) 92648

( * ) Notice: Subject to any disclaimer, the term of this patent is extended or adjusted under 35 U.S.C. 154(b) by 0 days.

(21) Appl. No.: 09/525,316

(22) Filed: Mar. 13, 2000

(51) Int. Cl.[7] ............................................. F21V 1/00
(52) U.S. Cl. .................. 362/240; 362/800; 362/369; 362/288; 362/249; 362/244; 362/241; 362/223; 362/217
(58) Field of Search ..................................... 362/240, 249, 362/244, 800, 217, 223, 241, 369, 288

(56) References Cited

U.S. PATENT DOCUMENTS

| 4,136,379 | * | 1/1979 | Chevali ................................. 362/241 |
| 4,748,545 | | 5/1988 | Schmitt . |
| 4,941,072 | | 7/1990 | Yasumoto et al. . |
| 5,103,382 | * | 4/1992 | Kondo et al. ......................... 362/800 |
| 5,367,441 | | 11/1994 | Wustich . |
| 5,503,637 | * | 4/1996 | Kyricos et al. ......................... 607/88 |
| 5,607,227 | | 3/1997 | Yasumoto et al. . |
| 5,655,830 | | 8/1997 | Ruskouski . |
| 5,688,041 | | 11/1997 | Arndt . |
| 5,753,996 | * | 5/1998 | Csoknyai .............................. 362/217 |
| 5,845,037 | * | 12/1998 | Miekis ................................. 362/223 |
| 5,860,730 | * | 1/1999 | Hesprich .............................. 362/217 |
| 5,890,794 | | 4/1999 | Abtahi et al. . |
| 6,158,882 | * | 12/2000 | Bishoff, Jr. ........................... 362/800 |

* cited by examiner

*Primary Examiner*—Sandra O'Shea
*Assistant Examiner*—Guiyoung Lee
(74) *Attorney, Agent, or Firm*—Gordon K. Anderson

(57) ABSTRACT

A light emitting diode light strip that uses a rigid hollow tube (20) sized to accommodate a printed circuit board (22) which has a positive and negative bus extending the full length of the board. One or more resistors (38) are in contact with the positive bus on one end and a series of light emitting diodes (44) on the other. The diodes are mounted through holes (34) in the board and the anode of the diode is in communication with a resistor while the cathode of the diode contacts an adjacent diode anode connecting them in linked series through traces on the bottom of the circuit board. The end cathode in each series, engages the negative bus forming a predetermined group of diodes electrically coupled to a single resistor on one end and the negative bus on the other. A pair of end caps (50) enclose the tube and an electrical cable (60) is connected through the caps to the busses on the circuit board. A power supply (64) is in contact, through the electrical cable, with the board providing low voltage direct current power through the busses to a predetermined group of light emitting diodes, for illumination of the area surrounding the light strip.

18 Claims, 3 Drawing Sheets

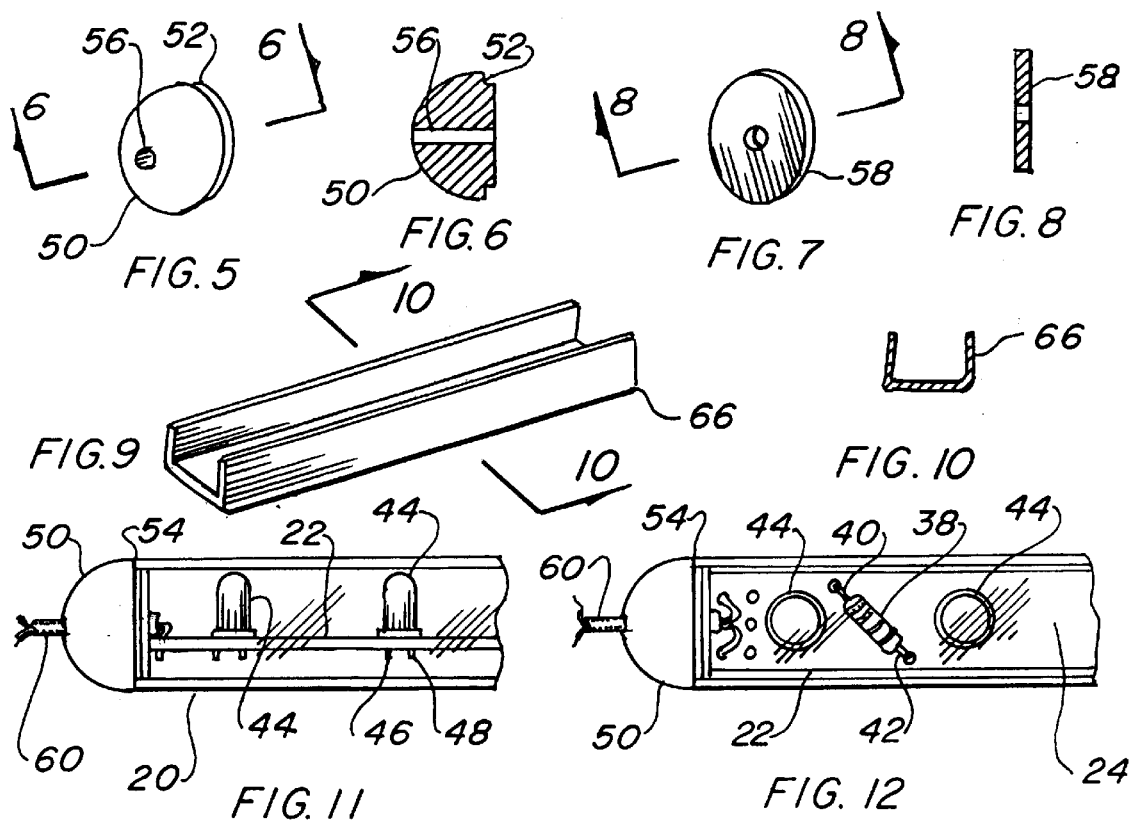

LIGHT EMITTING DIODE LIGHT STRIP

TECHNICAL FIELD

The present invention relates to light strips in general. More specifically to a light strip having diodes mounted on a printed circuit board disposed within a transparent or translucent tube.

BACKGROUND ART

Previously, many types of light strips have been used in endeavoring to provide an effective means to produce light with a minimum amount of heat. Some prior art has been developed that places a series of light emitting diodes in various tubes or bulbs with reflectors for maximizing the light emitted. Others have used liquid inside the tube along with the light emitting diodes to transmit the heat to the outside surface. Standard light bulb bases have been used for connection to sockets and others have utilized couplings for attachment together forming a long lamp assembly.

A search of the prior art did not disclose any patents that read directly on the claims of the instant invention, however the following U.S. patents are considered related:

| U.S. Pat. No. | Inventor | Issue Date |
| --- | --- | --- |
| 5,890,794 | Abtahi et al. | Apr. 6. 1999 |
| 5,688,041 | Arndt | Nov. 18, 1997 |
| 5,655,830 | Ruskouski | Aug. 12, 1997 |
| 5,607,227 | Yasumoto et al. | Mar. 4, 1997 |
| 5,367,441 | Wustich | Nov. 22, 1994 |
| 4,941,072 | Yasumoto et al. | Jul. 10, 1990 |
| 4,748,545 | Schmitt | May 31, 1988 |

Abtahi et al. in U.S. Pat. No. 5,890,794 teaches a light unit having a flexible circuit board with a number of LED's extending outward from the front side and is covered with a transparent cover forming an outer cavity. The printed circuit board is supported by the housing in which a second cavity is formed. In a second embodiment the board is rigid and the LED's extend outwardly. In either case the outer cavity is filled with liquid for cooling.

U.S. Pat. No. 5,688,041 issued to Arndt is for a lighting device consisting of a string of LED's in a circuit which is housed within a hollow transparent tube. Each axial end of the tube is equipped with a coupling permitting a detachable connection of another lamp assembly.

U.S. Pat. No. 5,655,830 of Ruskouski discloses a lighting system having a lamp assembly made of a hollow translucent or transparent tube connected to a standard light bulb base. Inside the tube are housed, a series connected string of light emitting diodes, various resistors and a capacitor also a surge suppression device. The LED'S may be either discrete type or the die-on type mounted on one or both sides of a printed circuit board.

U.S. Pat. No. 5,367,441 Wustich discloses an illuminating device used as a background surface of a display with a circuit board having LED's and inner reflecting surfaces. The circuit board is made of a light-transmissive material and serves as the background surface to be illuminated. The circuit board leads and LED's are connected for controllability and a scattering body of light-transmissive potting compound fills the interior of a frame. The scattering centers are in the form of glass particles.

U.S. Pat. No. 4,748,545 Schmitt discloses an illumination system for a display cabinet having a plurality of low voltage lamps in a clear cylindrical housing. An air space between a reflector and the housing provide thermal insulation preventing overheating in a display cabinet.

For background purposes and as indicative of the art to which the invention is related, reference may be made to the remaining cited patents issued to Yasumoto et al. in both U.S. Pat. Nos. 5,607,227 and 4,941,072 which are directed to linear light sources consisting of an integrated lens and reflective frames for housing a base plate with LED's arranged in a line.

DISCLOSURE OF THE INVENTION

Light strips of one type or the other have been in use for some time with the most popular being the fluorescent tube type which has utility in a wide variety of applications, however, it also has its limitations as the ballast must be included in the fixture making the entire light rather large relative to the size of the lamp. It is therefore a primary object of the invention to have a light strip that uses solid state light emitting diodes and is only the size of its transparent or translucent enclosing tube. The invention requires only a single power supply that will energize up to 350 LED's in the white configuration and 700 colored devices, permitting the use of a large number of strips with a single power supply.

An important object of the invention is that the use of LED's reduces power consumption to a bare minimum as each device uses only 0.0124 Watts of power and is extremely efficient as far as illumination is concerned. The normal procedure for determining the effectiveness of each type of illuminating device is to compare the efficiency of the light source in terms of the amount of light produced in relation to the amount of power consumed. This relationship is expressed in lumens per watt or (LPW). For general comparison an incandescent light has an index of less than 24, a halogen lamp is only slightly better at 25, a mercury vapor is around 65 and a fluorescent lamp is in the neighborhood of 75 according to the type, whereas a light emitting diode (LED) in the T 1 ¾ style has a rating of almost 89.

Another object of the invention is that it is cool in operation which makes the light ideal for applications such as lighting candy displays in stores and markets. It has been found by actual usage that a two foot long light strip having 24 diodes has a temperature rise of only ten degrees F.(5.6 degrees C.) at a prevailing ambient temperature of 70 degrees F. (21.1 degrees C.) within the confines of a typical display cabinet. This advantage may be utilized in a host of other applications as the light strip is not hot to the touch and therefore may be used safely around people particularly children.

Still another object of the invention is the life of the LED compared to other light sources. Data available, generally indicates that a common incandescent lamp has a life expectancy of somewhere around 2,000 hours and a fluorescent lamp may last in the 10,000 hour range. The life of a light emitting diode is ten times better than that of the fluorescent lamp in that the life of a LED is approximately 100,000 hours. This means that a LED could operate continuously for a period of over eleven years before failure would be expected.

Yet another object of the invention is directed to its small physical size. It may be clearly seen that the light strip may be used in place of a fluorescent lamp with a comparable size bulb as no ballast is required adjacent to the lamp and the power supply may be positioned in a remote location preferably near a city power source such as a convenience outlet in a wall. Further since the light strip uses low voltage direct current power the wiring is considerably smaller and is not subject to local codes as a matter of fact the national electric code (NEC) classifies this type of wiring as Class 2 which excludes it from most strict city power local codes. It has been found that number 22 American Wire Gauge (AWG) is completely adequate for the application and is considerably smaller and easier to handle than normal 120 volt AC wire.

A further object of the invention is the sturdiness of the device as the LED's are solidly mounted in a circuit board which in turn is held captive in a hollow thermoplastic tube permitting it to be completely vibration resistant. Further the tube is plugged on each end with a clear plastic end cap and the wire penetrating the cap is potted or sealed in such a manner as to make the invention waterproof. These two features make a strong and robust light strip compared to incandescent lamps that are subject to damage with vibration and fluorescent lamps that are fragile and dangerous to handle.

A final object of the invention is the ease of installation of the light strip as a U-shaped channel base, fabricated of an extruded plastic, may be attached to an object with adhesive or conventional fasteners and the light strip snapped into place between the upstanding legs of the channel. Since the invention is relatively light in weight and the channel is sized to offer a firm grip the union is positive and yet easy to remove. Attachment methods are numerous and well known in the art making this type of installation easy, convenient and inconspicuous.

These and other objects and advantages of the present invention will become apparent from the subsequent detailed description of the preferred embodiment and the appended claims taken in conjunction with the accompanying drawings.

BRIEF DESCRIPTION OF THE DRAWINGS

FIG. 5 is a partial isometric view of one of the end caps completely removed from the invention for clarity.

FIG. 6 is a cross-sectional view taken along lines 6—6 of FIG. 5.

FIG. 7 is a partial isometric view of one of the resilient gaskets completely removed from the invention for clarity.

FIG. 8 is a cross-sectional view taken along lines 8—8 of FIG. 7.

FIG. 9 is a partial isometric view of one of the U-shaped channel bases completely removed from the invention for clarity.

FIG. 10 is a cross-sectional view taken along lines 10—10 of FIG. 9.

FIG. 11 is a fragmentary elevation view of one end of the light strip showing the connection of the electrical cable to the printed circuit board.

FIG. 12 is a fragmentary top view of one end of the light strip showing the connection of the electrical cable to the printed circuit board.

FIG. 13 is a fragmentary top view of the printed circuit board less the resistors and LED's, shown by itself.

FIG. 14 is a fragmentary bottom view of the printed circuit board less the resistors and LED's, shown by itself.

BEST MODE FOR CARRYING OUT THE INVENTION

Figure 1:
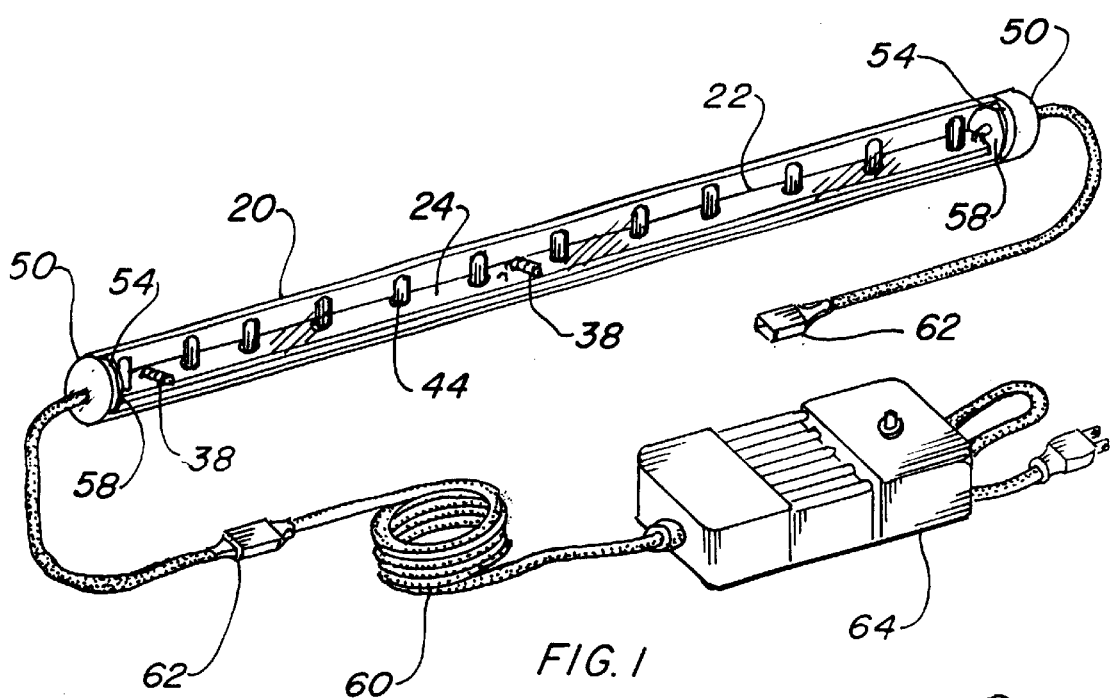
FIG. 1 is a partial isometric view of the preferred embodiment.
Figure 2:
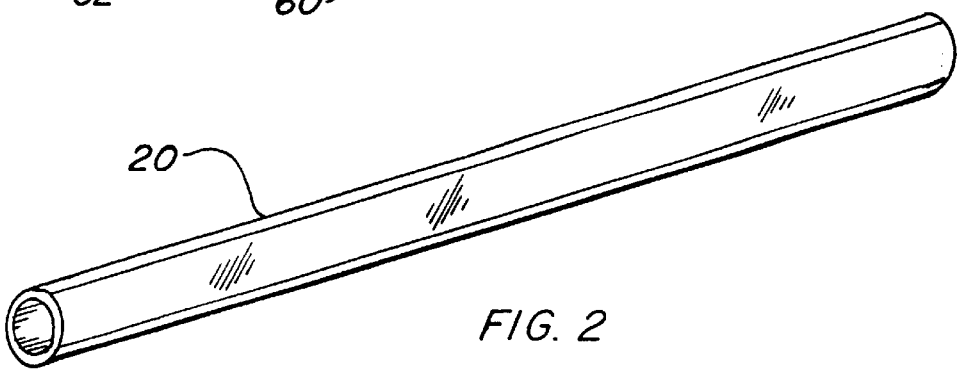
FIG. 2 is a is a partial isometric view of the hollow tube completely removed from the invention for clarity.

The best mode for carrying out the invention is presented in terms of a preferred embodiment. This preferred embodiment is shown in FIGS. 1 through 16 and is comprised of a rigid hollow tube 20 that is either transparent or translucent having appropriate light transmitting characteristics. The material of the tube 20 is preferably thermoplastic of a formulation such as polyethylene, polypropylene, polycarbonate or poly-vinyl-chloride, however, it has been found that acrylic or polycarbonate is ideal as they are both transparent and are basically rigid and have the structural integrity necessary for the application. The tube 20 may be any shape or diameter however 0.75 inch (1.9 cm) outside diameter has proven to been practical with a inside diameter of 0.60 inch (1.5 cm) also being an excellent choice. The length of the tube may also be selected for its practicality, which in the preferred diameter, is nominally 6 inches (15.25 cm), 12 inches (30.5 cm), 24 inches (61 cm), 48 inches (121.9 cm) and 72 inches (182.9 cm). Obviously other lengths may be used with equal ease and dispatch for various applications and specific circumstances.

A printed circuit board 22, slightly shorter than the tube 20 and just narrower than its inside diameter, is disposed within the tube contiguous with the hollow interior inside diameter as illustrated best in FIG. 11. The printed circuit board 22 is defined by an insulating substrate having a top 24 and a bottom 26. The top 24 has a reflective surface on its upper face to mirror light through the tube to the inventions immediate surroundings. The bottom 26 of the circuit board contains a fill length conductive positive bus 28 and a full length conductive negative bus 30 with each bus adjacent to an opposed outside edge of the board 22 as illustrated best in FIGS. 4 and 14. The board further has a plurality of traces 32 on the bottom 26 and also holes 34 with a plurality of pads 36 in communication with the traces 32 surrounding these holes 34 as shown in FIGS. 13 and 14. The material of the circuit board 22 is a dielectric substance well known in the art and commonly used in the industry.

Figure 3:
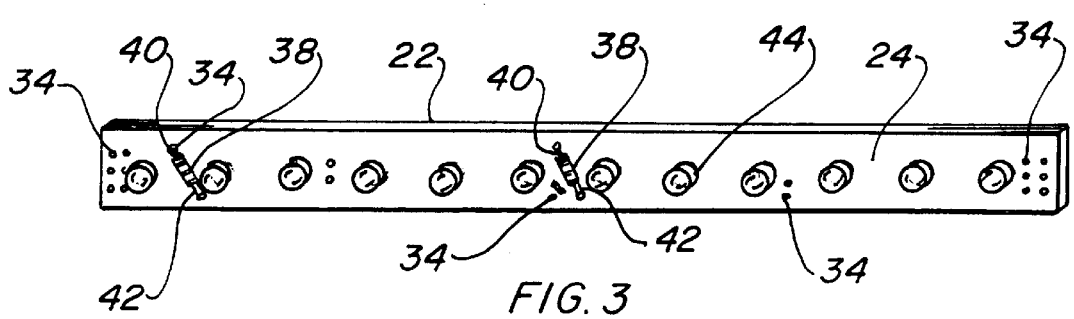
FIG. 3 is a partial isometric view of the top of the printed circuit board, completely removed from the invention for clarity.
Figure 4:
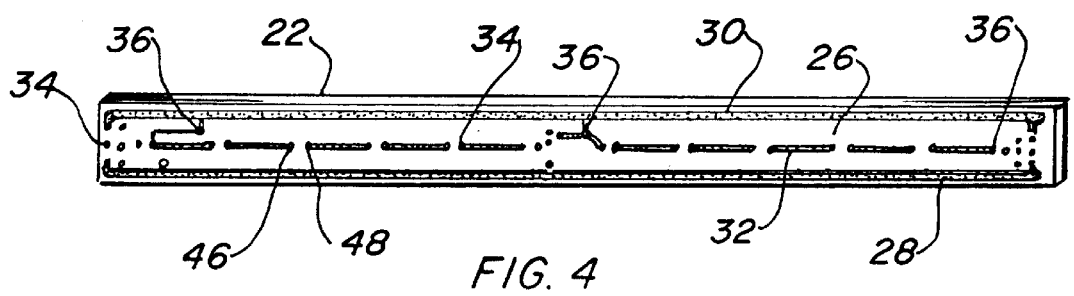
FIG. 4 is a partial isometric view of the bottom of the printed circuit board, completely removed from the invention for clarity.

One or more resistors 38 are mounted on the top of the printed circuit board 22. Each resistor 38 has a first wire lead 40 and a second wire lead 42 and the first wire lead 40 penetrates the board through one of the holes 34 in communication with the positive bus 28 as illustrated in FIGS. 3 and 4. The second wire lead 42 penetrates contiguously with one of the pads 36 touching a trace 32. Both wire leads 40 and 42 are soldered to the pads 36 on the bottom of the printed circuit board 22 holding them rigidly in place. The resistors 38 are preferably the fixed type of a value that drops or reduces the voltage to an appropriate LED level for efficient operation of the light strip.

A plurality of light emitting diodes 44 are disposed at the center of the top 24 of the printed circuit board 22 in linear alignment with each other as depicted in FIGS. 3, 11 and 12. Each diode 44 includes a anode 46 and cathode 48 projecting therefrom, with both of these projections penetrating holes 34 in the circuit board 22 engaging the pads 36 and traces 32 underneath on the bottom 26. The anode 46 is in communication with the second lead 42 of one of the resistors and the cathode 48 in communication with an adjacent diode 44 connected in linked series through the traces 32 on the bottom 26 of the circuit board 22. The end diode in the series engages the negative bus 30 forming a predetermined group of diodes electrically coupled to a single resistor 38 on one end and the negative bus 30 on the other. It has been found that six white diodes 44, linked in the series connected predetermined group, is basically ideal however other combinations may also be used for the group. The drawings depict two sets of series groups each having the requisite resistor 38 however as many groups as desired may be used, with only the limitation of practically to consider. There are many and varied types of light emitting diodes 44 on today's market that may be useful in this invention however a, so called, type T 1¾ has proven to be successful in the arrangement and the colors of white, blue, green, blue-green, red, yellow, amber and orange are readily available and are viable selections for the invention. It should be noted that each specific diode 44, along with its color, has its own physical characteristics which may require the resistor 38 to be sized accordingly therefore not all resistors are identical in the series connected predetermined group. For example a white light diode 44 operates most efficiently being energized by 3.6 volts whereas a red diode produces optimum light with 1.8 volts.

A pair of end caps 50 captivate the printed circuit board 22 within the tube 20 and are configured basically as a half sphere. While a simple half sphere is an acceptable outline contour, it is preferred to use a half sphere including an integral stepped shoulder 52, as shown in FIGS. 5 and 6, that permits interfacing into the hollow of the tube 22 with a slip fit. In any event the end caps 50 are held in place with fastening means, such as a cement or adhesive 54 which makes the joint waterproof thereby hermetically sealing the tube 20. It should be noted that the same type of material may be selected for the end caps 50 as used with the tube 20 for the benefit of appearance and for compatibility with the adhesive 54 however transparent or translucent material is favored with acrylic functioning satisfactorily in this application. A bore 56 is placed through the end cap 50 to permit an electrical connection to be made with the busses 28 and 30 on the board 22 as shown in FIG. 6.

A resilient gasket 58 is disposed between the printed circuit board 22 and each end cap 50 for positioning and holding the printed circuit board 22 captive within the hollow tube 20. This gasket 58 is illustrated in FIGS. 7 and 8 and consists of a round thin disc with a hole in the center made of resilient thermoplastic. The material may be any type of a resilient substance, such as closed cell sponge or soft shore rubber like plastic, with silicone being preferred. The gasket 58 is positioned between the end cap 50 and the board 22 with the gasket compressed until it deforms around the entire end of the board firmly holding it in place creating a solid connection making the entire light strip shock and vibration resistant.

An electrical cable 60 engages the busses 28 and 30 through the bore 56 in one or both of the end caps 50 as shown in FIGS. 1, 11, 12, 15 and 16. This electrical cable is preferably a two conductor wire of a 22 AWG size housed in a protective sheath. The wire size may be of any circular mil rating as long as it has the electrical characteristics to conduct the maximum amperage draw of the light strip, however, this 22 gauge wire is considered optimum for convenience and ease of handling. To complete the integrity of the light strip hermetic seal, the cable 60 is either potted with a compound that surrounds the individual wires or a caulking material is applied at the interface, both of the materials harden sufficiently in time to prevent the intrusion of water into the tube 20. The electrical cable 60 utilizes a double flag spade connector 62 on an end opposite an end that engages the busses 28 and 30. It should also be noted that any other type of electrical connector may also be used with equal ease as many similar types of disconnects are in use and well known in the electrical field. The light strip may use a cable 60 connected to the busses on a single end or on both ends and the connector may be male or female according to the requirement of the application, as depicted the example illustrated in FIG. 16.

A power supply 64 is furnished for the light strip that is in contract with the electrical cable 60 providing low voltage direct current power to each of the predetermined groups of light emitting diodes for illumination from the light strip. This power supply 64 preferably has a 100/240 volt 50/60 hertz primary, and from 9 to 24 volt direct current secondary, with a capacity of at least 1.8 amperes at 24 volts. It should also be noted that the voltage may vary as to the type and color of the light emitting diodes 44 being used in the system as the resistors 38 must reduce the direct current voltage to correspond with the value required by the predetermined group of diodes being used in a particular light strip. Similarly the amperage capacity will obviously vary as to the number of systems using the same power supply 64. It will also be noted that this power supply component is in current production in a myriad of styles and types and as such is readily available in today's market.

Figure 15:
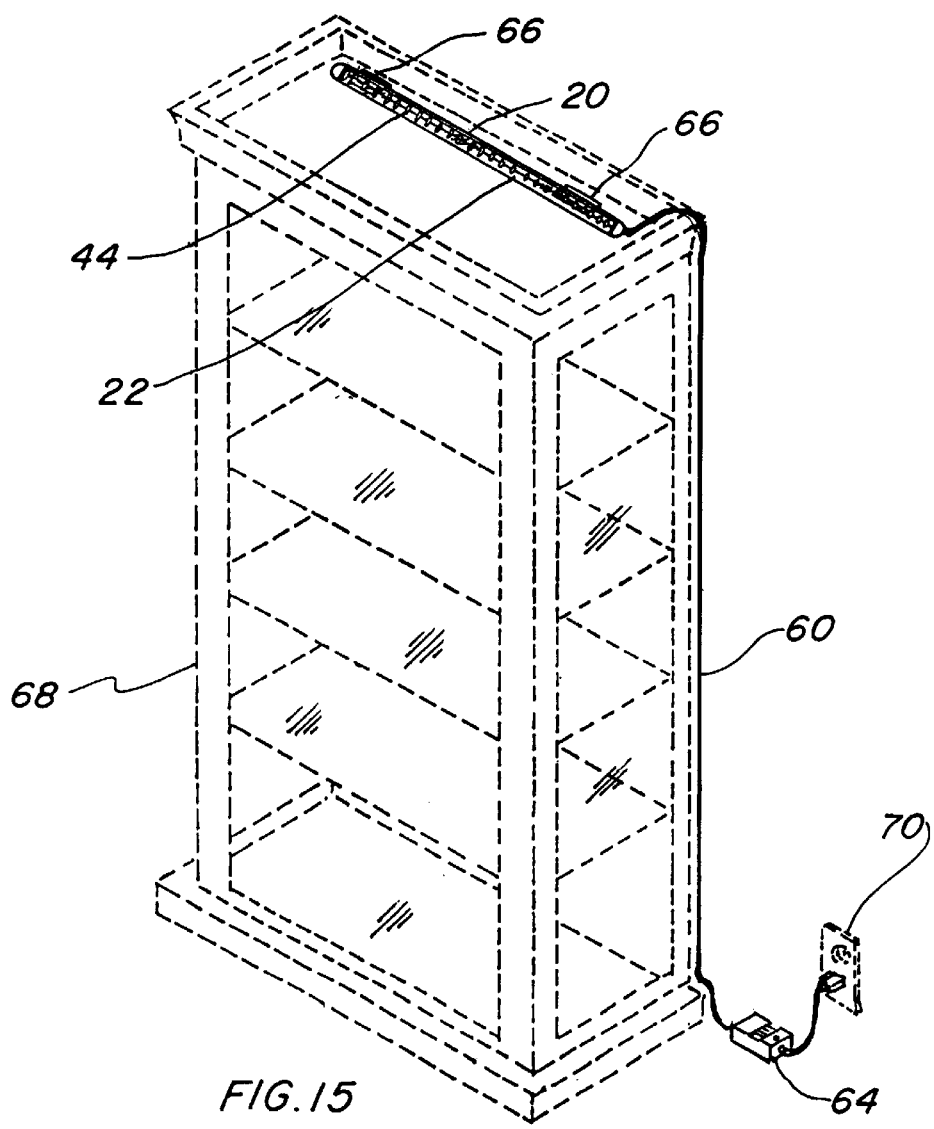
FIG. 15 is a partial isometric view of a china cabinet shown in dotted lines with the preferred embodiment of the invention illustrated under the cabinet top shining light onto the shelves.

To complete the invention a U-channel base 66 is provided that is sized to grasp and retain the hollow tube 20 in a removable manner thereby holding the light strip in place when one or more of the U-channel bases 66 are attached to an object. FIGS. 9, 10 and 15 illustrate this base 66 which is formed of an extruded thermoplastic and may be attached by glue, adhesive, threaded hardware or any other convenient method. The base 66 may be pre-punched with holes or a pressure sensitive adhesive may be placed on the bottom to complete the mounting.

Figure 16:
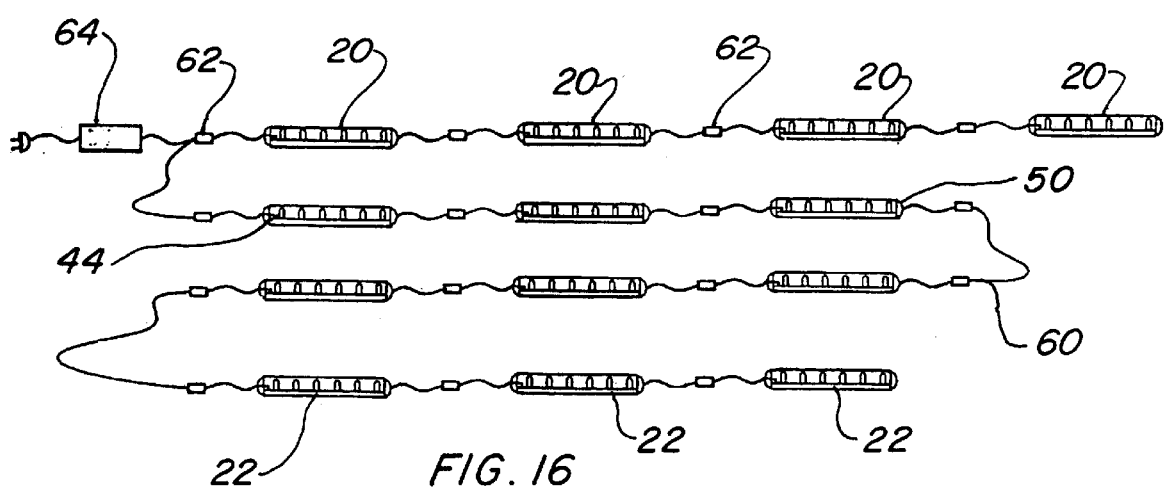
FIG. 16 is a diagram of a number of light strips attached together using a single power supply.

FIG. 16 illustrates the attachment of a number of light strips connected together since both ends of each strip may have a cable 60 and connector 62 attaching the busses 28 and 30 together therefore parallel connections may be easily made between light strips such that a large number of devices may be connected together limited only by the capability of the power supply 64.

FIG. 15 illustrates a typical installation of the light strip in a china cabinet 68 (shown in dotted lines) with two bases 66 attached to the inside of the top and the light strip snapped into place in the bases. The top of the printed circuit board 22 is inverted and the LED's are facing downwardly in the direction of the glass shelves lighting the entire cabinet 68. The cable 60 is located at the side of the cabinet 68 and the power supply 64 is positioned on the floor connected to an electrical outlet 70 in an adjacent wall. This illustration of an installation is only one of a myriad of applications for the light strip as its use is unlimited since it may be applied to a utility such as use in candy display cabinets, skylights, soffet lighting, step lighting, under kitchen cabinets etc. The uses also include replacement of neon signs and colored light displays in a unbounded combination.

While the invention has been described in complete detail and pictorially shown in the accompanying drawings, it is not to be limited to such details, since many changes and modifications may be made in the invention without departing from the spirit and scope thereof. Hence, it is described to cover any and all modifications and forms which may come within the language and scope of the appended claims.

What is claimed is:

1. A light emitting diode light strip comprising:
    a rigid hollow tube having light transmitting characteristics,
    a printed circuit board defined by an insulating substrate having a top and a bottom, with a full length conductive positive bus and a full length conductive negative bus on the bottom, each bus adjacent to an opposed outside edge of the circuit board, further the circuit board having a plurality of traces on the bottom and holes therethrough, with the circuit board disposed within the tube contiguous with a hollow interior portion thereof,
    a plurality of resistors having a first wire lead and a second wire lead with the resistors disposed on the top of the printed circuit board with the first wire lead penetrating the board in communication with the positive bus,
    a plurality of light emitting diodes each having an anode and a cathode termination with the diodes disposed on the top of the printed circuit board and the terminations penetrating the holes in the circuit board with the anode in communication with the second lead of one of the resistors and the cathode in communication with an adjacent anode connected in linked series through the traces on the bottom of the circuit board, with an end cathode in the series engaging the negative bus forming a predetermined group of diodes electrically coupled to a single resistor on one end and the negative bus on the other,
    a pair of fixed hermetically sealed end caps captivating the printed circuit board within the tube, held in place with fastening means,
    a resilient shock and vibration resistant gasket compressed between said printed circuit board and each end caps until it deforms, for positioning and holding the printed circuit board captive within the hollow tube,
    at least one electrical cable engaging the busses through at least one of the end caps, and
    a power supply in contract with the electrical cable for providing low voltage direct current power to each of the predetermined groups of light emitting diodes for illumination from the light strip.

2. The light emitting diode light strip as recited in claim 1 wherein said rigid hollow tube is transparent.

3. The light emitting diode light strip as recited in claim 1 wherein said rigid hollow tube is translucent.

4. The fight emitting diode fight strip as recited in claim 1 wherein said rigid hollow tube is thermoplastic.

5. The light emitting diode light strip as recited in claim 1 wherein said printed circuit board further comprising a reflective surface on the top to mirror light from the diodes through the tube to its immediate surroundings.

6. The light emitting diode light strip as recited in claim 1 wherein said printed circuit board further comprises a plurality of pads in communication with the traces surrounding the holes for accommodating resistors and light emitting diodes.

7. The light emitting diode light strip as recited in claim 1 wherein said resistors further comprise a fixed resistor type.

8. The light emitting diode light strip as recited in claim 1 wherein said light emitting diodes further radiate a white fight.

9. The light emitting diode light strip as recited in claim 1 wherein said fight emitting diodes further radiate a colored light.

10. The light emitting diode light strip as recited in claim 1 wherein said end caps further comprise a half sphere including an integral stepped shoulder which interfaces within the hollow of the tube in a slip fit and said end caps each having a bore therethrough for receiving said electrical cable.

11. The light emitting diode light strip as recited in claim 10 wherein said end cap fastening means further comprises an adhesive.

12. The light emitting diode light strip as recited in claim 1 wherein said electrical cable further comprises a two conductor wire of a 22 AWG size.

13. The light emitting diode light strip as recited in claim 1 wherein said electrical cable further comprises a double flag spade on an end opposite an end that engages the busses.

14. The light emitting diode light strip as recited in claim 1 wherein said power supply further comprises a 100/240 volt 50/60 hertz primary and from 9 to 24 volt direct current secondary with a capacity of at least 1.8 amperes at 24 volts.

15. The light emitting diode light strip as recited in claim 1 further comprising a U-channel base sized to grasp and retain the hollow tube in a removable manner thereby holding the light strip in place when the U-channel is attached to an object.

16. The light emitting diode light strip as recited in claim 1 wherein said end caps are fabricated of the same material as the tube.

17. The light emitting diode light strip as recited in claim 1 wherein an electrical cable distends from each end cap with each cable having a connector of opposite gender permitting like light strips to be electrically connected in series.

18. A light emitting diode light strip comprising:
    a hollow tube having light transmitting characteristics,
    a printed circuit board having a top and a bottom with a full length conductive positive bus and a full length conductive negative bus on the bottom, with the circuit board disposed within the tube,
    a plurality of resistors having a first wire lead and a second wire lead with the resistors disposed on the top of the printed circuit board with the first wire lead penetrating the board and communicating with the positive bus,
    a plurality of light emitting diodes disposed on the top of the printed circuit board in communication with one of the resistors and also in communication with a set of diodes connected in linked series, forming a predetermined group of diodes electrically coupled to a single resistor with an end diode in the set engaging the negative bus,
    a pair of fixed hermetically sealed end caps capitavating the printed circuit board within the tube,
    a resilient shock and vibration resistant gasket compressed between said printed circuit board and each end caps until it deforms, for positioning and holding the printed circuit board captive within the hollow tube, and
    a power supply in contract through an electrical cable providing low voltage direct current power through the busses to each of the predetermined groups of light emitting diodes for illumination from the light strip.

* * * * *